(12) United States Patent
Ogura et al.

(10) Patent No.: US 6,366,500 B1
(45) Date of Patent: Apr. 2, 2002

(54) PROCESS FOR MAKING AND PROGRAMMING AND OPERATING A DUAL-BIT MULTI-LEVEL BALLISTIC FLASH MEMORY

(75) Inventors: Seiki Ogura; Tomoko Ogura, both of Wappingers Falls, NY (US)

(73) Assignee: Halo LSI Device & Design Technology, Inc., Wappingers Falls, NY (US)

( * ) Notice: Subject to any disclaimer, the term of this patent is extended or adjusted under 35 U.S.C. 154(b) by 0 days.

(21) Appl. No.: 09/656,395

(22) Filed: Sep. 6, 2000

Related U.S. Application Data

(62) Division of application No. 09/313,302, filed on May 17, 1999, now Pat. No. 6,133,098.

(51) Int. Cl.[7] ............................................... G11C 16/04
(52) U.S. Cl. .............................. 365/185.29; 365/185.14
(58) Field of Search ........................ 365/185.14, 185.29, 365/185.18, 185.05; 438/257–267; 257/320, 314, 315, 316

(56) References Cited

U.S. PATENT DOCUMENTS

| | | | |
|---|---|---|---|
| 5,278,439 A | | 1/1994 | Ma et al. ..................... 257/319 |
| 5,494,838 A | * | 2/1996 | Chang .......................... 438/43 |
| 5,654,917 A | | 8/1997 | Ogura et al. ............ 365/185.18 |
| 5,929,480 A | * | 7/1999 | Hisamune ............... 365/185.02 |

OTHER PUBLICATIONS

Ogura et al., "Low Voltage, Low Current, High Speed Program Step Split Gate Cell with Ballistic Direct Injection for EEPROM/Flash", IEDM 1998, p. 987.

* cited by examiner

*Primary Examiner*—A. Zarabian
(74) *Attorney, Agent, or Firm*—George O. Saile; Stephen B. Ackerman; Rosemary L. S. Pike

(57) ABSTRACT

An fast program, ultra-high density, dual-bit, multi-level flash memory process, which can be applied to a ballistic step split gate side wall transistor, or to a ballistic planar split gate side wall transistor, which enables program operation by low voltage requirement on the floating gate during program is described. Two side wall floating gates are paired with a single word line select gate, and word lines are arranged to be perpendicular both the bit lines and control gate lines. Two adjacent memory cells on the same word line do not require an isolation region. Also, the isolation region between adjacent memory cells sharing the same bitline is defined by the minimum lithography feature, utilizing a self align fill technique. Adjacent memory cells on the same word line share bitline diffusion as well as a third poly control gate. Control gates allow program and read access to the individual floating gate. In addition to the dual-bit nature of the cell, density can be even further improved by multi-level storage. In one embodiment, the dual multi-level structure is applied to the ballistic step split gate side wall transistor. In a second embodiment, the dual multi-level structure is applied to the ballistic planar split gate side wall transistor. Both types of ballistic transistors provide fast, low voltage programming. The control gates are used to override or suppress the various threshold voltages on associated floating gates, in order to program to and read from individual floating gates. The targets for this non-volatile memory array are to provide the capabilities of high speed, low voltage programming (band width) and high density storage.

45 Claims, 12 Drawing Sheets

PROCESS FOR MAKING AND PROGRAMMING AND OPERATING A DUAL-BIT MULTI-LEVEL BALLISTIC FLASH MEMORY

This is a divisional patent application of Ser. No. 09/313,302 filed on May 17, 1999, now U.S. Pat. No. 6,133,098 issued on Oct. 17, 2000.

BACKGROUND OF THE INVENTION

1) Field of Invention

The invention relates to methods of forming high-density flash memory arrays and the resulting high density flash memory arrays.

2) Description of the Prior Art

In the NOR-type memory cell, the polysilicon memory select gate is connected to a word line, one floating gate-side diffusion is connected to a source line, and the other diffusion is connected to a bit line. Word lines run parallel to the source lines and perpendicular to the bit lines. Better density may be achieved when the source lines are rotated to run parallel to the bit lines, and then combined into single lines. Such high density flash memory arrays, having interchangeable bit lines/source lines between adjacent cells, have been described in previous works such as U.S. Pat. No. 5,654,917 (IBM) to S, Ogura et al, and U.S. Pat. No. 5,278,439 to Yueh Y. Ma: "Self-aligned dual-bit split gate (DSG) flash EEPROM cell".

Referring to FIG. 1, a schematic of the high density array described in U.S. Pat. No. 5,654,917 is shown. The memory cell is a planar two polysilicon structure, and source and drain regions are interchangeably shared between adjacent cells on the same word line (WL0 or WL1, for example). Read access for this array operates using the current sensing "domino" method or the "skippy domino" method, in which read is limited to serial applications. The bit line to be sensed (one of B0–B4) is always the line that is closest to the selected floating gate. The line on the opposite side of the word gate is then grounded. All other bit lines are precharged to the same voltage as the word line high voltage (VDD). Sensing begins when the word line is raised to VDD. In this approach, if the selected cell has a low threshold and the bit line drops below VDD-Vt, then the adjacent cell which shares the same bit line may also start to conduct, depending on its threshold state, and interfere with the bit line signal. Thus, sensing must be completed before the bit line drops beyond VDD-Vt. This stipulation renders sensing of multi-level thresholds difficult, if not impossible.

An array from Yueh Y. Ma's "Self-aligned dual-bit split gate (DSG) flash EEPROM cell" is shown in FIG. 2A. A cross-section of 2A (2B—2B) is shown in FIG. 2B. The memory cell is a triple polysilicon split gate structure in which the floating gate 22 is polysilicon level 1, the control gate 26 is polysilicon level 2, and the word select gate 30 is polysilicon level 3. Source/drain diffusions 40 are placed every two floating gates apart, thus improving density over the conventional cell, which has separated source and drain regions. Although two floating gates share the same word gate, source and drain regions, read and/or program to a single floating gate is possible because control gates are separated. Above each of the floating gates lies a control gate which controls the voltage of the individual floating gate by capacitance coupling. The control lines run parallel to the source/drain. Some of the disadvantages of the DSG cell are high program voltages of about 12V and also high voltages during read. A high control gate voltage of 12V is required during read operation when one of the floating gates is being accessed in order to mask out the effects from the other floating gate. Adjacent cells which may share the same diffusion or control gate voltages will be effectively disabled from the operation by suppressing the other floating gate with a very low ~0 control gate voltage. The same kind of over-ride and suppress techniques are used during program in order to target a single floating gate cell. In this way, program and read operations can be performed on the high density, self-aligned dual-bit split gate flash/EEPROM cell. However, the highest density ideal memory will be one that not only uses silicon area effectively, but also implements multi-level storage.

SUMMARY OF THE INVENTION

In this invention, a fast program, low voltage, ultra-high density, dual-bit, multi-level flash memory is achieved with a three or four-polysilicon split gate sidewall process.

The structure and operation of this invention is enabled by the ballistic transistor which provides high electron injection efficiency at low program voltages of 3~5V. The ballistic transistor is described in the article, "Low Voltage, Low Current, High speed program step split cell with ballistic direct injection for EEPROM/ Flash," by S. Ogura et al, IEDM 1998, pg. 987. The cell structure is realized by (i) placing floating gates on both sides of the word gate, and (ii) isolating between the floating gates using a self-aligned isolation scheme which renders the floating gate width equal to the active device width. Third level poly control gates are also formed by the self-alignment method and are shared between memory cells. The control gates enable multi-level storage on each of the floating gates because they can over-ride the coupling between the floating gates and the word line. Key process elements used in this process are:

(i) Disposable sidewall process to fabricate ultra short channel with or without step structure and sidewall floating gate (ii) Self-aligned filling $SiO_2$ between word gates, (iii) Control gate polysilicon runs between floating gates on top of and in the direction of the bit line diffusion, perpendicular to the top word gate Features of the fast program, low voltage, ultra-high density, dual-bit, multi-level flash memory of the present invention include:

1. high density dual-bit cell that can store multi-levels;
2. low current, low voltage programming by ballistic injection;
3. third level control poly gates to over-ride word gate coupling to the floating gate.

A summary of the operating conditions for multi-level storage is given in FIG. 3B. During read, the following conditions need to be met: the voltage of the unselected floating gate within a selected memory cell must be greater than the threshold voltage of the floating gate+source voltage. The word select gate in the floating gate pair is raised to the threshold voltage of the word gate+an override delta of around 0.5V+source voltage (Vt-wl+Voverdrive+Vs). Un-selected floating gates will be disabled by reducing the associated control gates to 0V. Program conditions are: Word line voltage is greater than threshold+an overdrive voltage delta for low current program. Both floating gates in the selected pair are greater than Vt-high+override delta. The floating gate voltages are determined by the voltages of the control gates and the word gates, and their respective coupling ratios. Adjacent floating gates sharing the same word line voltage are disabled by adjusting the control gates only.

Operating conditions of this cell are unique because the cell utilizes the ballistic injection mechanism for fast low voltage program, and two floating gates per word gate with control gates between adjacent cells require additional voltage constraints not found in more conventional one floating gate/one word gate memories. This fast program, low voltage, ultra-high density, dual-bit, multi-level flash memory cell has a smaller density than the DSG cell. Sidewall processing can cut the cell size by more than half. This cell has higher performance. Ballistic injection for program results in faster, low voltage program. Lower control gate voltage is found in this cell. In the DSG cell, floating gate coupling depends mainly on the control gate. In the cell of the present invention, floating gate coupling comes from both the word gate and the control gate. Thus, control gate voltage during program and read can be lower. Bit erase is possible in the inventive memory cell. In DSG, in both cases of F-N tunneling erase from floating gate to diffusion, or from floating gate to control gate, erase occurs in a column, parallel to the bit line. Erase of a single cell is not possible. However, in the inventive cell, because the coupling is divided more equally between the control gate and the word gate, it is also possible to put a negative voltage on a single word gate, and erase a single bit. The present invention provides faster and better control for multi-level program. Because the ballistic injection has low current program, it is possible to apply autoprogram to this cell This allows better threshold control in less time because there is no need for a separate verification step.

Thus, by a combination of a dual-density cell structure and multi-level storage, a high density memory cell can be made. Furthermore, the high density memories described in this invention have the additional features of fast random access, and low voltage, fast program.

BRIEF DESCRIPTION OF THE DRAWINGS

In the accompanying drawings forming a material part of this description, there is shown.

DESCRIPTION OF THE PREFERRED EMBODIMENTS

Presented in this invention is a fabrication method for a sidewall spacer floating gate transistor with two floating gates and two shared control gates. The method can be applied to a device with a flat floating gate channel and/or a device having a step channel under the floating gate.

Figure 4A:
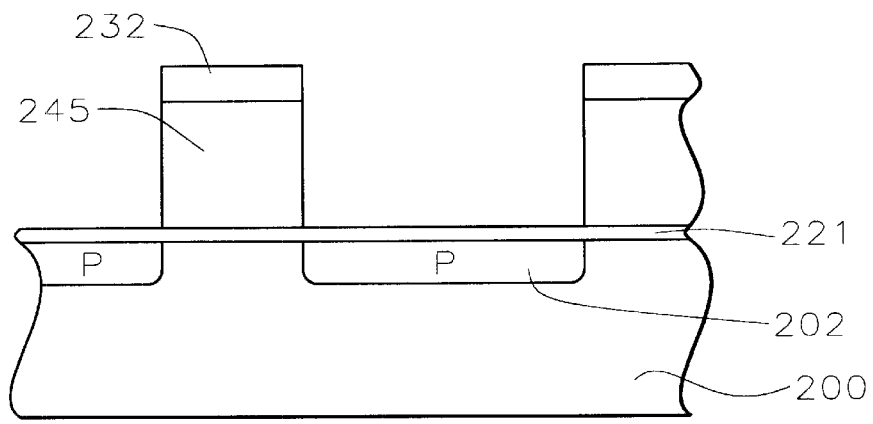
FIGS. 4A through 4J are cross sectional representations of a first preferred embodiment of the process of the present invention.

The procedures for formation of shallow trench isolation, p-well, and n-well are the same as for conventional CMOS processing and will not be shown. The polysilicon word gate is also defined by conventional CMOS processing as shown in FIG. 4A. In order to define the word gate, the memory gate silicon oxide 221 is formed to a thickness of between about 6 and 10 nanometers. Then the polysilicon 245 with a thickness of between about 150 and 250 nm for the gate material is deposited by chemical vapor deposition (CVD). A nitride layer 232 is deposited by CVD to a thickness of between about 20 and 50 nm to be used later as an etch stop layer for chemical mechanical polishing (CMP). Normal CMOS processing defines the memory word gates; i.e., photoresist and masking processes with exposure, development, and vertical etching of the nitride 232 and polysilicon 245 by reactive ion etching (RIE) are performed. Extra boron 202 is ion implanted at low energy (less than about 10 KeV energy) with an ion dosage of between 3E12 to 3E13 ions per $cm^2$, in order to adjust VT under the floating gate. After removing the photoresist which was used to define the word gate, the word gate is obtained as shown in FIG. 4A.

Figure 4B:
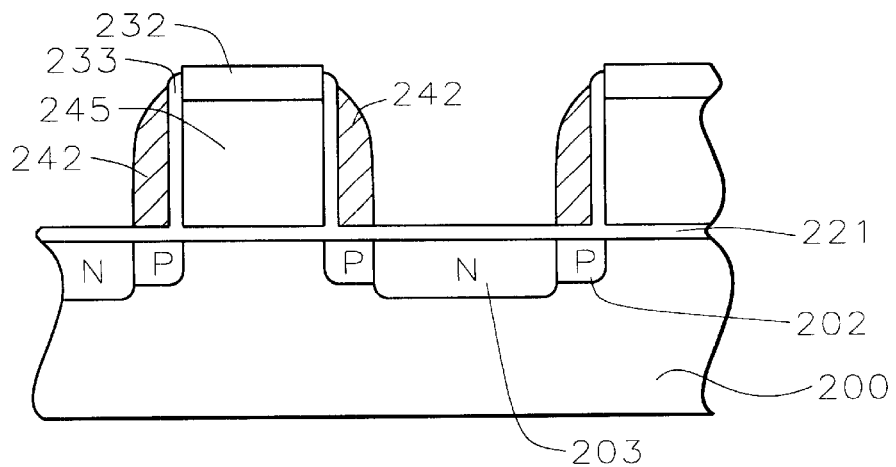

A thin silicon oxide layer 233 of between about 5 and 10 nm can be thermally grown on the side wall polysilicon, or $SiO_2$ and/or SiN film can be deposited by uniform CVD, as shown in FIG. 4B. Then the disposable sidewall process, which is the key element to obtain fast programming by high electron injection efficiency, is performed. A thin polysilicon layer typically having a thickness of between about 20 to 50 nm is deposited. Then a vertical or anisotropic polysilicon etch is performed, which forms the disposable sidewall spacer 242 on both sides of the word gate 245, as shown in FIG. 4B. Implantation with an N- dopant 203 such as arsenic or phosphorus is performed. Thus, the thickness of the polysilicon layer determines the effective channel length under the floating gate.

Figure 4C:
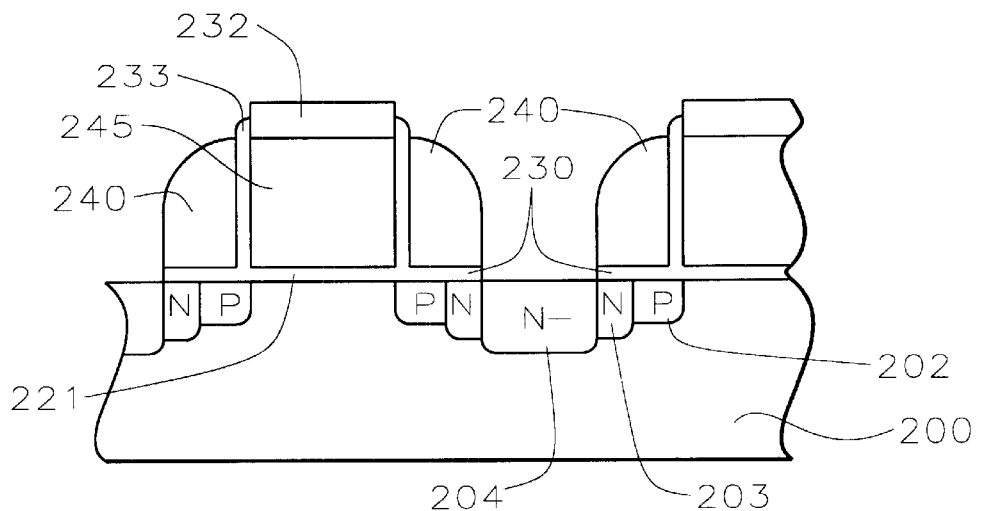

Referring now to FIG. 4C, the disposable side wall spacer 242 is gently removed by a dry chemical anisotropic etch. A typical etch ambient for this step is $HBr/Cl_2/O_2$. The bottom silicon oxide 221 is then gently etched out by buffered (with for example water of ammonium hydroxide) hydrofluoric acid (BHF), Vapor HF, or a reactive ion etch such as $CF_2/O_2$. A thermal oxidation layer 230 is grown to a thickness of between about 6 and 9 nm. Or, a thin CVD of silicon oxide 230 with a thickness of between about 6.5 to 9.0 nm is deposited and rapid thermal oxidation is added to increase the oxide thickness to be between about 7.5 to 10.0 nm. Short nitridation in an $N_2O$ or NO environment can be added to improve the silicon oxide reliability and endurance. As an additional option to reduce the erase voltage, a thin silicon rich oxide can be deposited at this point, up to 10 nm. A portion of the oxide layer 233 is lost during etching of the oxide layer 221. Oxide layer 234, shown in FIG. 4C, comprises 233 plus some of the new floating gate oxidation.

Now, an insitu phosphorous-doped polysilicon layer, which becomes the floating gate, is deposited having a thickness of between 90 to 180 nm. A vertical or anisotropic polysilicon etch is performed to form the sidewall floating gate 240, as shown in FIG. 4C. A thin CVD of silicon oxide or nitride 233 with a thickness of about 10 nm is deposited. Phosphorus and/or Arsenic for N+ 204 is implanted subsequently, at a dosage of between 3E14 to 5E15 ions per $cm^2$, as shown in FIG. 4C.

Figure 4D:
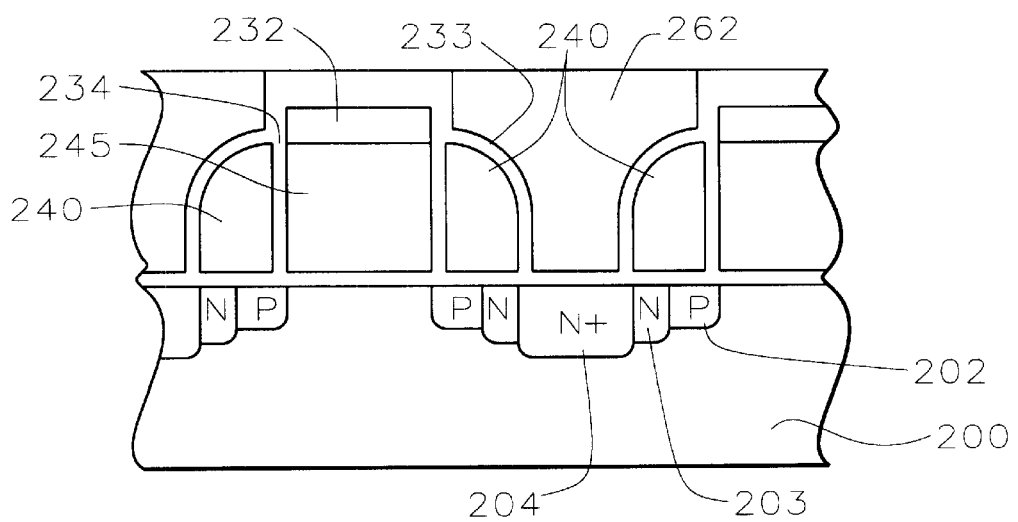

A layer of photoresist 262 having a thickness of greater than the sum of word polysilicon 245 and nitride layer 232 is spin coated. After hardening the photoresist by deep UV light, the resist over the word gate nitride is planarized by Chemical Mechanical Polishing using the nitride layer as the CMP stop layer. Alternatively, the gap filling material can be spin-on-glass (SOG) or BPSG rather than photoresist. These materials will also be planarized using CMP. These materials can be removed easily without etching the $SiO_2$ and SiN, but provide similar etching rates during dry etch of the silicon and $SiO_2$ for FG—FG isolation. At this point the photoresist 262 fills the gap between word gates as shown in FIG. 4D.

Figure 4E:
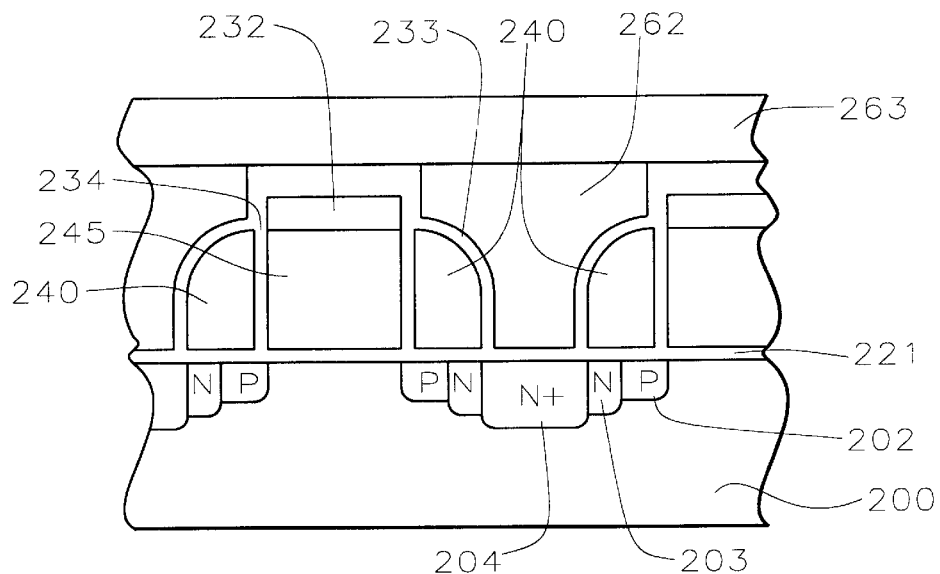
Figure 4F:
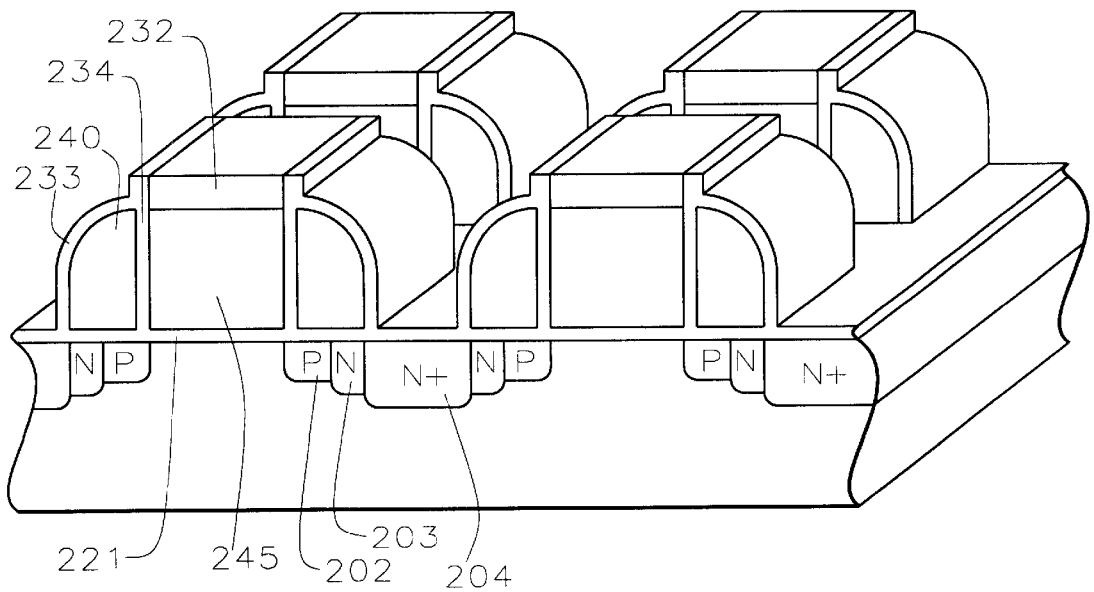
Figure 4G:
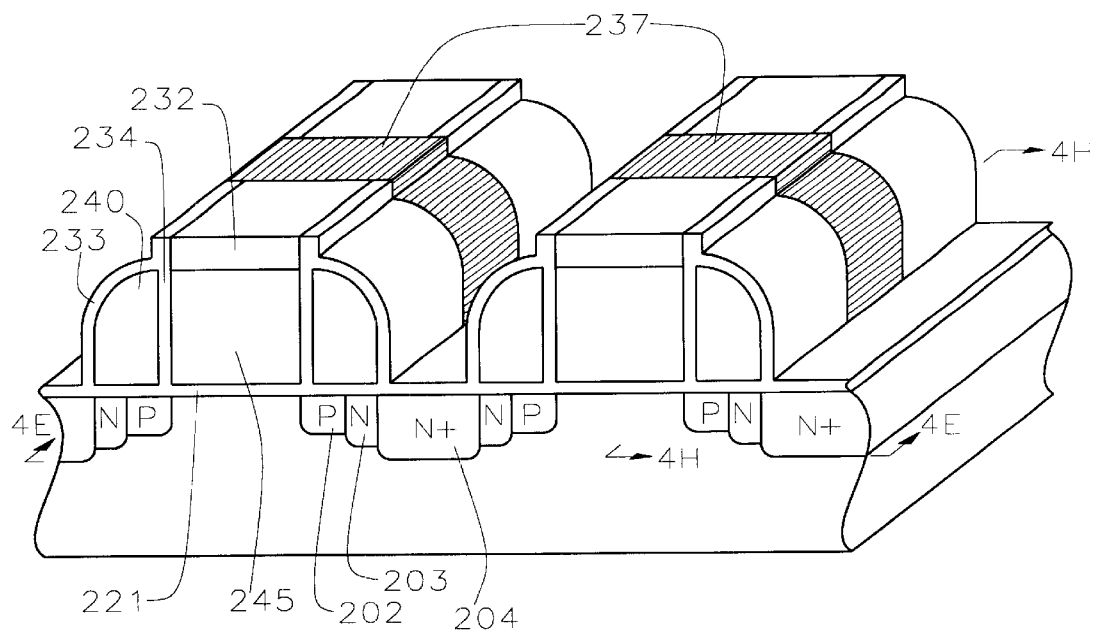
Figure 4H:
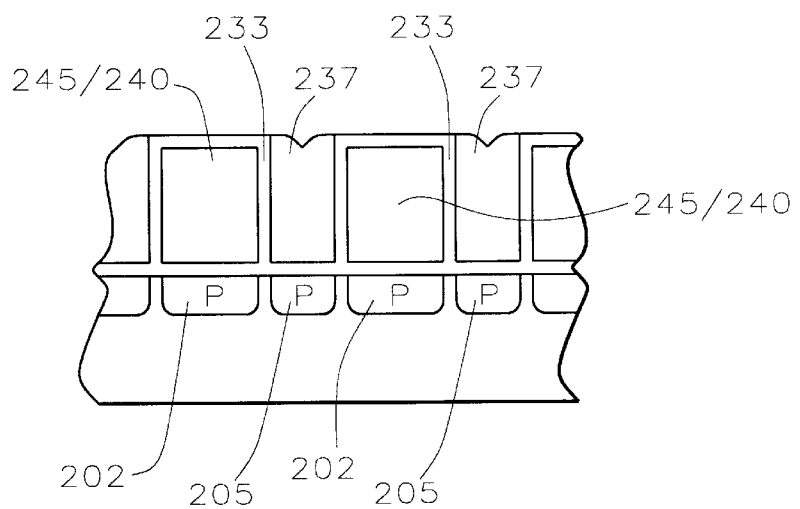

Referring now to FIG. 4E, a second photoresist layer 263 is coated on top of the planarized layer 262. A slit-mask, which defines the word line and floating gate at the same time (in the direction of the bit line), is then applied. Using the developed photoresist 263 as an etching mask, the polysilicon word gate is isolated by etching nitride 232, polysilicon 245 and floating polysilicon 240 as shown in FIG. 4F. The fill material 262 is provided to protect against over-etch of the N+ region 204. Prior to removing the photoresist for the slit-cut, boron 205 in FIG. 4H, is ion implanted (dosage of between 5E12 to 5E13 per $cm^2$) to block the leakage current between adjacent word gate and floating gate channels. After photoresist 263 and/or SOG/BPSG 262 are removed, the structure looks like FIG. 4F.

Referring now to FIG. 4H, CVD silicon oxide is formed to a thickness of between about 6 and 10 nm on the slit-cut side wall of the word and floating gates. Then, a nitride layer is deposited by CVD to a thickness of between about 6 and 10 nm. Layer 233 is a composite of the oxide and nitride layers.

A layer of CVD silicon oxide 237 is deposited, completely filling the slit gap. For example, for a slit cut gap of approximately 0.18 microns, about 100 nm of CVD oxide will be sufficient. Next, a vertical reactive ion etch of the 100 nm CVD silicon oxide is performed. Now the slit gap is filled with CVD $SiO_2$ 237 as shown in FIG. 4G and FIG. 4H.

Figure 4I:
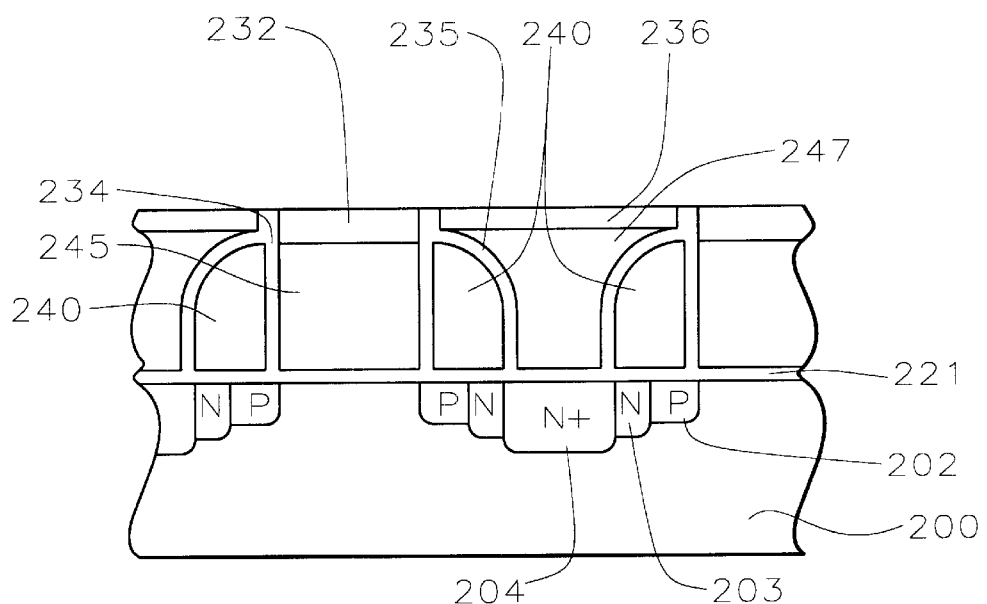

Since the oxide/nitride layer 233 is partially etched and damaged during the RIE $SiO_2$ process, the layer 233 is removed gently in a $H_3PO_4$ solution. A new layer composite layer of oxide (6 to 9 nm) and nitride (6 to 9 nm) 235 is formed, as shown in FIG. 4I. This is followed by deposition of another layer of polysilicon 247 (slightly thicker than the gap height of about 200 to 250 nm) to fill the floating gate gap and to form the control gate. Then the polysilicon layer is polished by CMP up to the nitride layer 232. After etching the polysilicon a few nanometers, a thermal oxidation of approximately 20 nm or a CVD $SiO_2$ deposition and CMP is performed, as illustrated by 236. The cross section of the device at this point is shown in FIG. 4I.

Figure 4J:
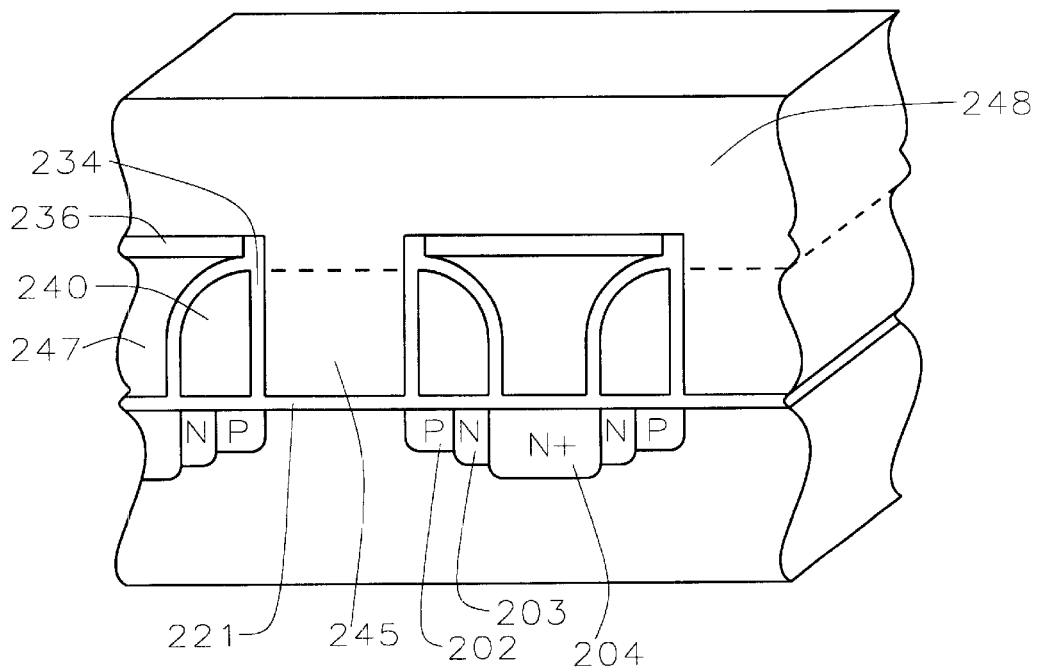

The nitride layer 232 is selectively etched by $H_3PO_4$ or etched by a chemical dry etch. The polysilicon layer thickness of between 150 and 200 nm is deposited by CVD. This polysilicon layer 248 is defined by normal photoresist and RIE processes. The structure at this point is as shown in FIG. 4J.

Figure 4K:
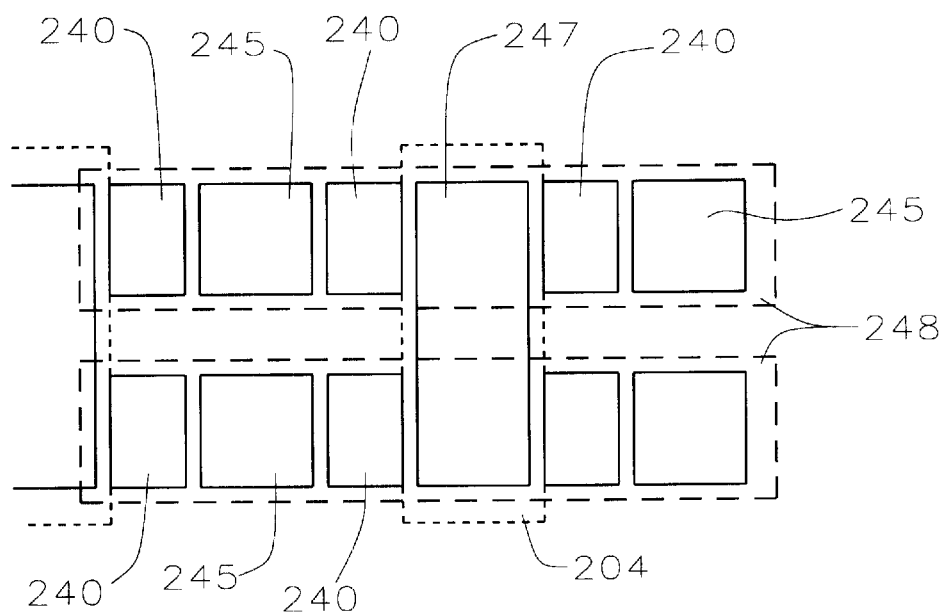
FIG. 4K is a bird eye's view of the completed memory cell of the present invention.

The polysilicon layer 248 acts as a word line wire by connecting adjacent word line gates. The final memory cell is completed at this point. This word polysilicon layer can be silicided with Ti or Co to reduce the sheet resistance. A typical bird's-eye view of the memory cell is shown in FIG. 4K.

The preceding processes describe fabrication of planar channel floating gates with very short channel (30 to 50 nm). By modifying and adding a few process steps, a step split structure with ballistic injection can be fabricated using the same process integration scheme. This second embodiment of the present invention will be described with reference to FIGS. 5B, 5C, and 5J.

Figure 5B:
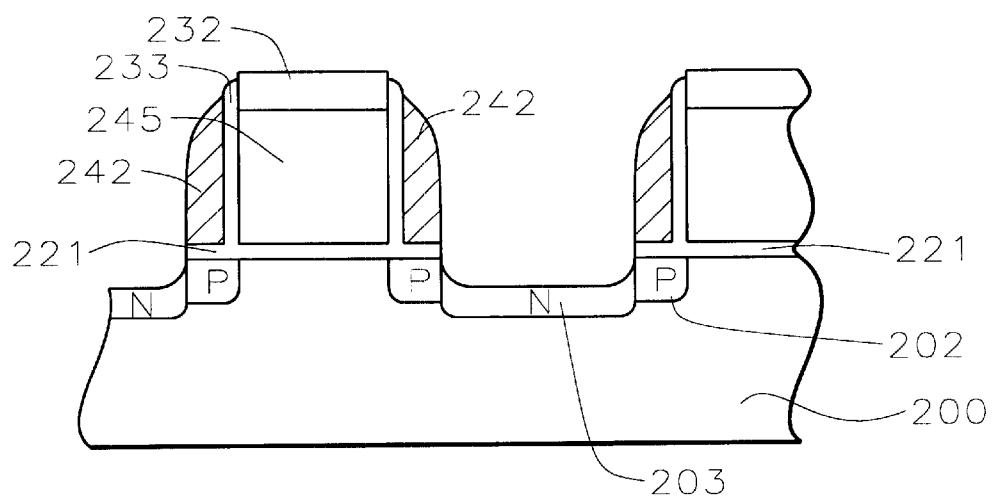
FIGS. 5B, 5C, and 5J are cross sectional representations of a second preferred embodiment of the process of the present invention.

After forming disposable sidewall spacer 242 by etching vertically the doped polysilicon, the silicon oxide layer 221 is vertically etched which corresponds to FIG. 4B. In order to form a step split memory cell, the deviation starts at this point by continuing to etch into the silicon substrate by approximately 20 nm. Then the bottom of the step is lightly implanted by Arsenic or Phosphorus to form N-region 203 using the poly sidewall as a mask as shown in FIG. 5B. Next, the N+ doped polysilicon disposable spacer is selectively removed by a wet etch ($HNO_3$/HF/Acitic Acid, or $H_3PO_4$) or a dry plasma etch to the lightly doped bulk N− region. The bulk etching during this disposable spacer etch can be included as part of step etching. After gently etching off the left over gate oxide 221 under the disposable polysilicon spacer, the silicon surface is cleaned. The total step into silicon should be about 20 to 50 nm. If the step corner is sharp, corner rounding by rapid thermal anneal (RTA) at between about 1000 to 1100° C. for about 60 seconds can be added as an option or a hydrogen anneal at 900° C. and at a pressure of 200 to 300 mtorr can be performed. After these modifications and additions, the fabrication sequence returns to the procedures described previously.

Figure 5C:
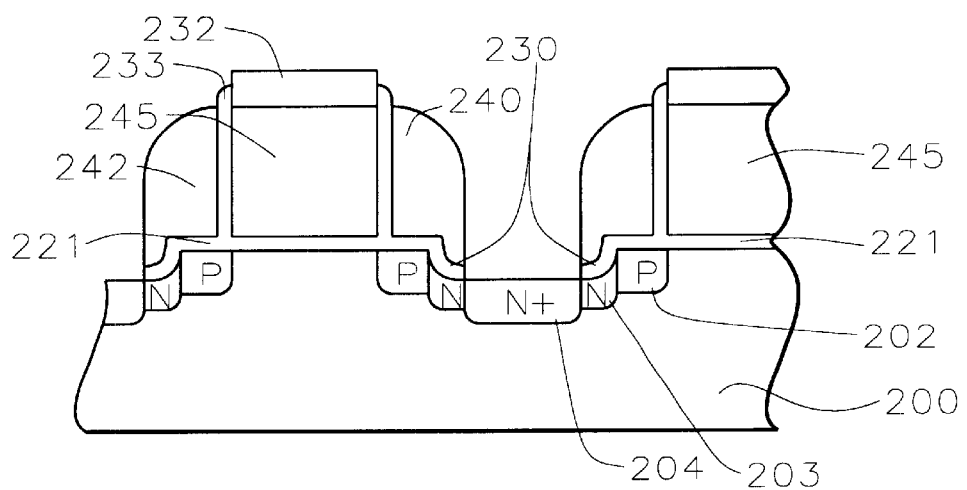

A thin CVD of silicon oxide 230, shown in FIG. 5C, with a thickness of between about 6.5 to 9.0 nm is deposited and rapid thermal oxidation is added to increase the oxide thickness to be between about 7.5 to 10.0 nm. Alternatively, the silicon oxide 230 can also be a thermally oxidized layer. Short nitridation in an $N_2O$ or NO environment can be added to improve the silicon oxide reliability and endurance.

Figure 5J:
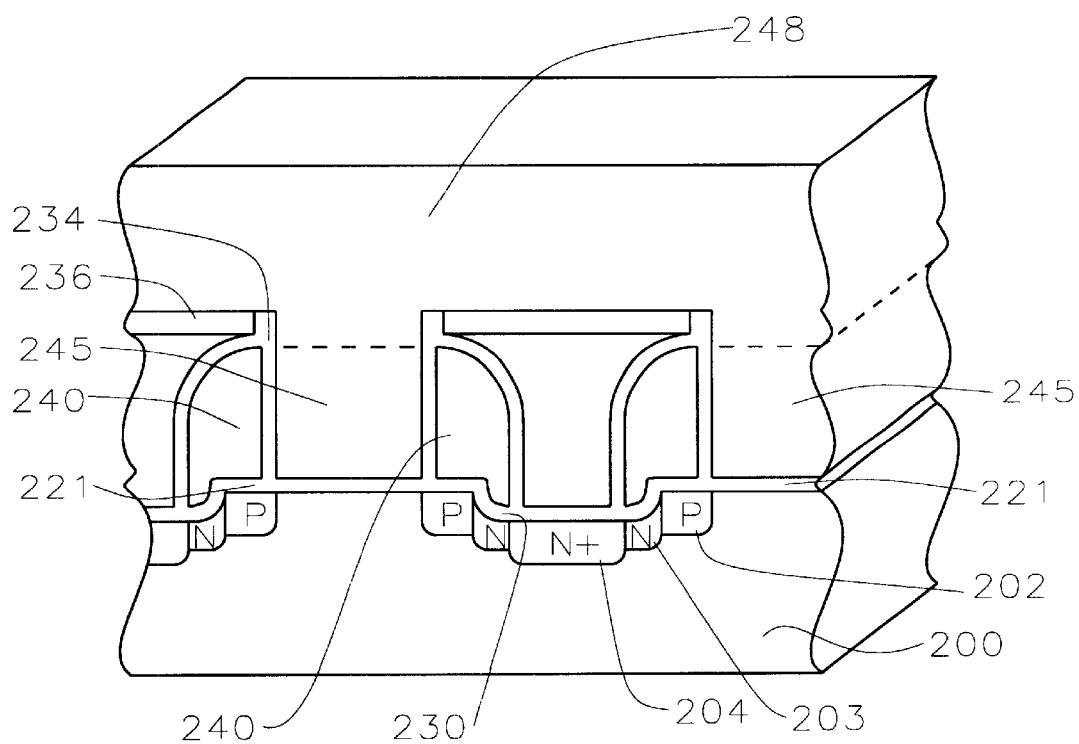

Then an insitu phosphorous-doped polysilicon layer, which becomes the floating gate, is deposited having a thickness of between 90 to 180 nm, and a vertical or anisotropic polysilicon etch is performed to form the sidewall floating gate 240, a shown in FIG. 5C. By following the process steps given for the planar split device, the step-split device can be fabricated as shown in FIG. 5J.

In the above process steps for both the planar and step devices, the disposable side wall spacer 242 can be plasma nitride or oxynitride instead of polysilicon, since the etching rate of that material to the thermal silicon oxide can be very high (for example at least 10–100 times) in $H_3PO_4$ acid or diluted HF.

Figure 6E:
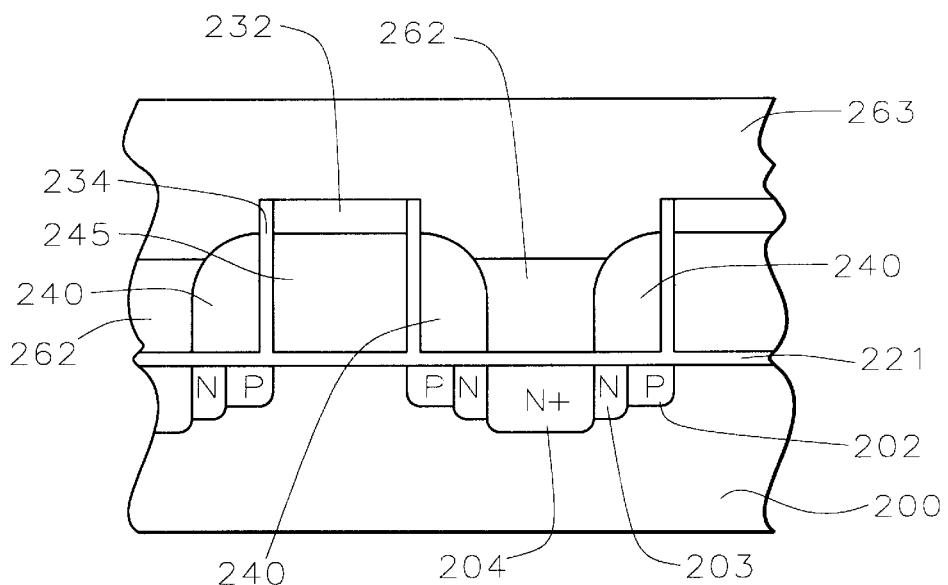
FIGS. 6E, 6F, 6I, and 6J are cross sectional representations of a third preferred embodiment of the process of the present invention.

A third embodiment of the present invention will be described with reference to FIGS. 6E, 6F, 6I, and 6J. Immediately after the sidewall polysilicon gates 240 are formed along the word gate 245 in FIG. 4C, photo-resist 263 is used to cut the floating gates as shown in FIG. 6E. During isolation etch of polysilicon side wall gates 240, if the etching ratio between polysilicon 240 and oxide 221 is not very high (<50), protection against etching through the oxide 221 can be achieved by adding the extra layer of photo resist 262. The layer 262 can be obtained by (i) first, uniform spin-coating and then (ii) vertically etching the resist half way, as shown in FIG. 6E. The photo resist is then hardened by UV light, and the normal photo resist process to cut sidewall floating gates is applied (shown as 263 in FIG. 6E).

Figure 6F:
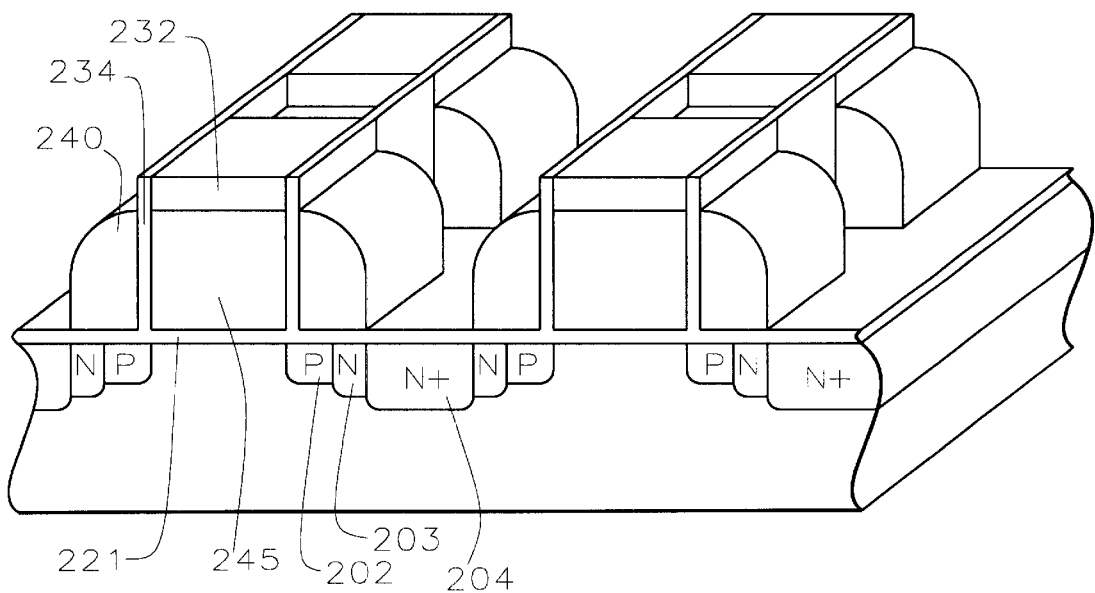
Figure 6I:
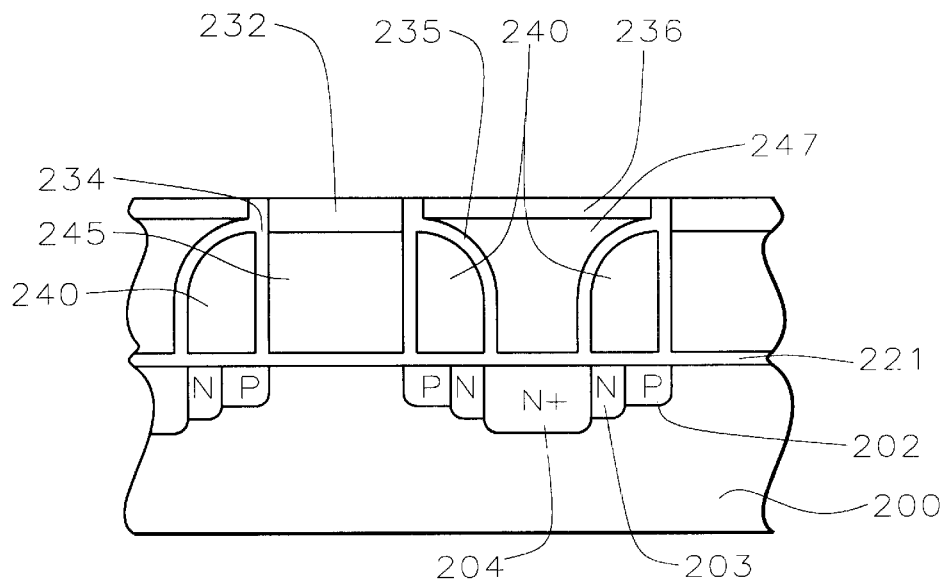
Figure 6J:
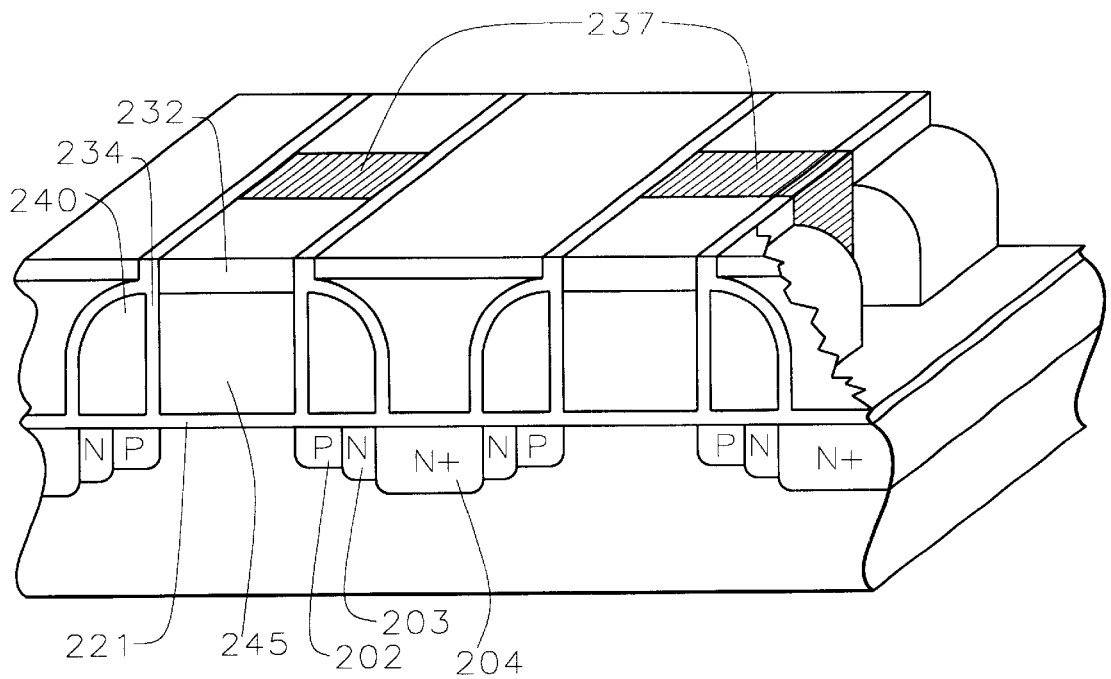

After defining polysilicon 240, the nitride layer 232 is etched by RIE using the same photo resist 263 as the etch mask; thus definition of the side wall gate and isolation region can be simultaneously self-aligned. After removal of the photo resists, the structure's appearance is as shown in FIG. 6F. Next, the composite dielectric layer 235 of oxide (6–9 nm) and nitride (6–9 nm) is deposited. N+ doped polysilicon 247 for the control gates is then deposited and the polysilicon is gently planarized by chemical mechanical polishing at the surface level of nitride 232. The polysilicon is vertically etched to be slightly more than the thickness of nitride 232. The polysilicon surface is oxidized, as shown as the oxide layer of 236 in FIG. 6I. The thin composite layer of oxide and nitride in the region which will later become oxide 237, shown in FIG. 6J, is then vertically etched and the exposed word polysilicon gate 245 is etched down to the oxide 221. A thin thermal oxide (<6 nm) is grown on polysilicon word gate 245 and CVD $SiO_2$ 237 (slightly greater than half of the area 237 separation, ~120 nm for 0.18 u separation) is deposited. Using the leftover nitride 232 as the CMP etch stop layer, the CVD $SiO_2$ layer is planarized as shown in FIG. 6J. After these steps, the structure corresponds to FIG. 4I. The process returns to FIG. 4I to complete the device.

The unique feature of this process is the isolation of adjacent word gates after floating gate and control gate definition. This isolation scheme involves CVD $SiO_2$ fill and chemical mechanical polishing, but does not require reactive ion etch, as in the previous method (provided in FIGS. 4D–4I). Therefore process control is better than the previous method.

In the embodiments described above, two approaches have been combined to improve flash memory density in this invention. In the first approach, density is more than doubled by sharing as many cell elements as possible; a single word select gate is shared between two side wall floating gates, and source lines/bit lines and control lines are shared between adjacent cells. In the second approach, multi-level thresholds are stored in each of the floating gates, and specific voltage and control conditions have been developed in order to make multi-level sensing and program possible for the high density array, with good margins between each of the threshold levels.

OPERATING METHOD FOR MULTI-LEVEL STORAGE

The procedures described below can be applied to multi-level storage of two bits and greater, as well as single-bit/two level storage applications in which Vt-hi and Vt-low are the highest and lowest threshold voltages, respectively, to be stored in the floating gate. The dual-bit nature of the memory cell comes from the association of two floating gates paired to a single word gate and the interchangeability of source and drain regions between cells. This cell structure can be obtained by a sidewall deposition process, and fabrication and operation concepts can be applied to both a step split ballistic transistor and/or a planar split gate ballistic transistor. The step split and the planar ballistic transistors have low programming voltages, fast program times, and thin oxides.

Figure 1:
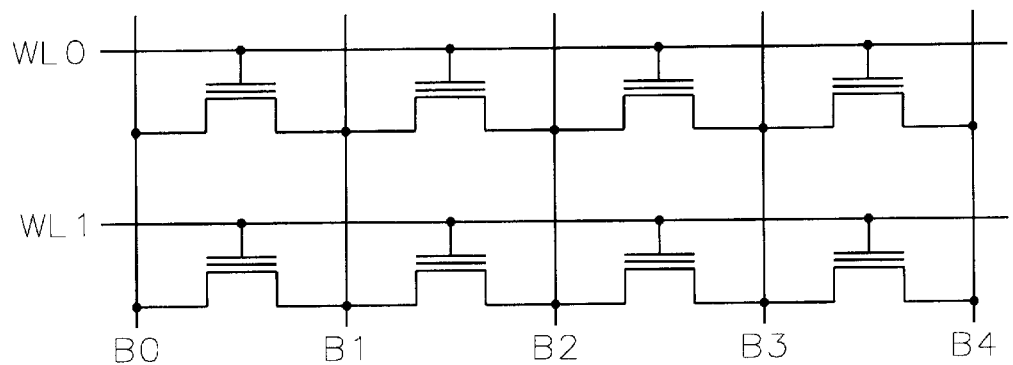
FIG. 1 is an array schematic of a prior art high density array.
Figure 2A:
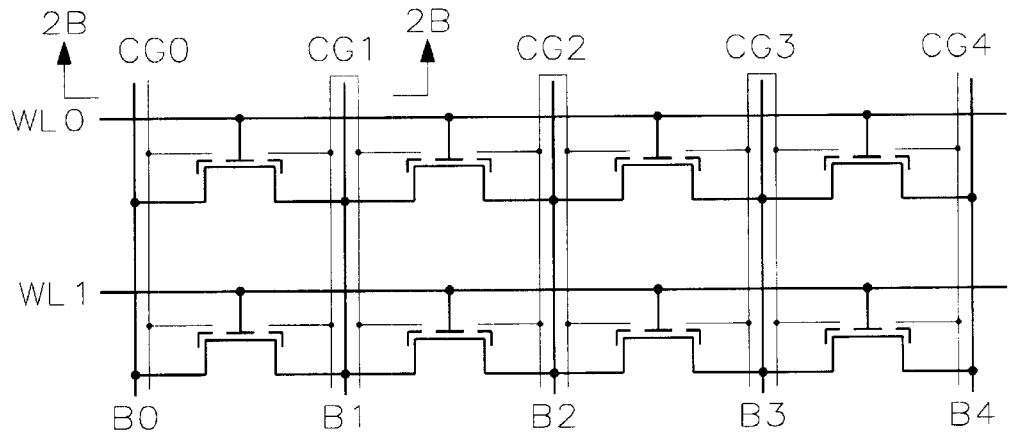
FIG. 2A is an array schematic of another prior art high density array.
Figure 2B:
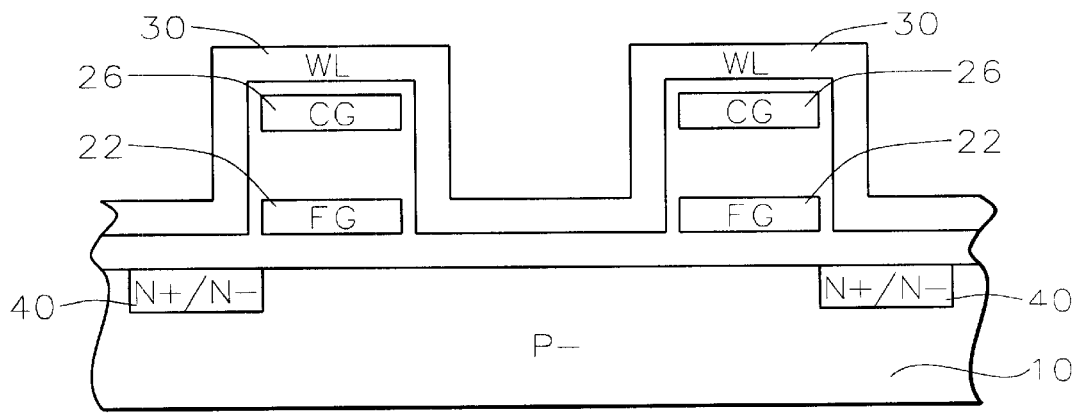
FIG. 2B is a layout cross-section of view 2B—2B of FIG. 2A of the prior art.
Figure 3A:
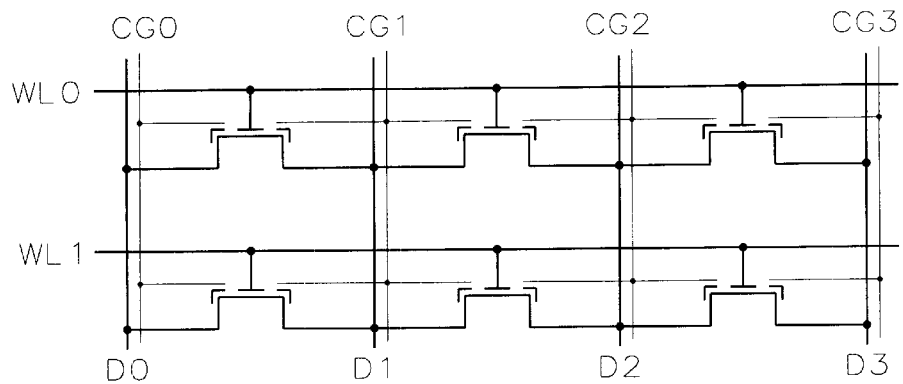
FIG. 3A is an array schematic of the double side wall dual-bit split gate cell with ultra short ballistic channel of the present invention.
Figure 3B:
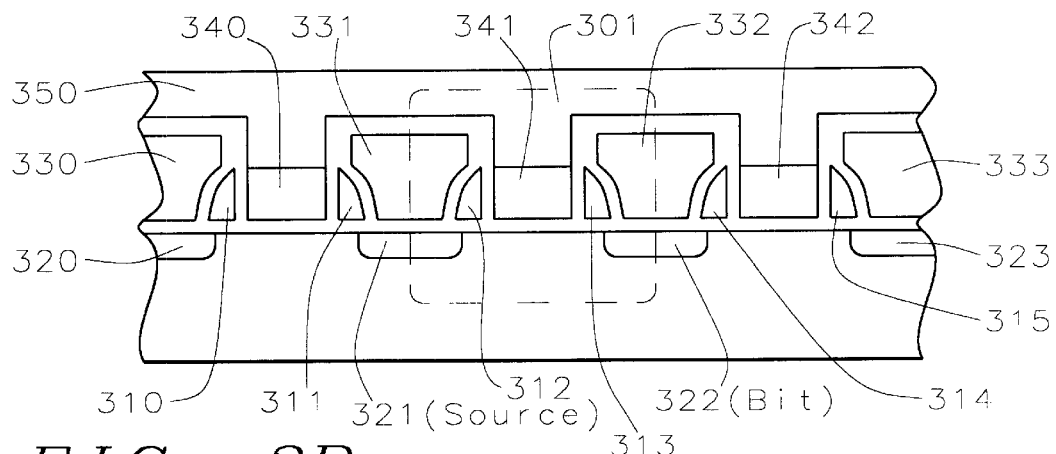
FIG. 3B is a layout cross-section of the double side wall dual-bit split gate cell with ultra short ballistic channel of the present invention.

A cross-section of the array for a planar split gate ballistic transistor application is shown FIG. 3B. All word gates 340, 341, and 342 are formed in first level polysilicon and connected together to form a word line 350. Floating gates 310, 311, 312, 313, 314, 315 are deposited in pairs on either side of the word gates 340, 341, and 342 by the sidewall spacer technique of the present invention Control gates 330, 331, 332, and 333 run directly above, and in the same direction as the diffusions 320, 321, 322, and 322, respectively. A feature of the side wall spacer technique is that the channel lengths of the floating gates can be very small, thus density is improved over conventional split gate cells. Control gates couple with the floating gates during read, program and erase operations. Thus, although a floating gate pair shares a single word gate, the voltage of each of the floating gates can be individually controlled by separate control lines. Density is significantly improved about 2 times by this arrangement.

Within a single memory cell 301, two floating gates 312 and 313 share a word select gate 341, and diffusions 321 and 322, shared between adjacent cells. A memory cell 301 can be described as having a source diffusion 321 and bit diffusion 322, with three gates in series between the source diffusion and bit diffusion, a floating gate 312, a word gate 341, and another floating gate 313. The word gate 341 is a simple logical ON/OFF switch, and voltage coupling between the control lines and the floating gates can allow individual expression of a selected floating gate's voltage state during read. Two floating gates which share the same word gate will be hereinafter referred to as a "FG pair." Within a single memory cell 301, one floating gate 313 is selected within a floating gate pair for read access or program operations. The "selected FG" 313 will refer to the selected floating gate of a selected FG pair. The "unselected FG" 312 will refer to the unselected floating gate of the selected floating gate pair. "Near unselected adjacent FG's" 311 and 314 will refer to floating gates of the FG pairs in the adjacent unselected memory cells which are closest to the selected memory cell 301. "Far unselected adjacent FG's" 310 and 315 will refer to the floating gates opposite the near unselected adjacent FG's within the same unselected adjacent memory cell FG pairs. The "source" diffusion 321 of a selected memory cell will be the farther of the two memory cell diffusions from the selected floating gate, and the junction closest to the selected floating gate will be referred to as the "bit" diffusion 322.

The voltage on a floating gate is determined by the sum of all the surrounding capacitance coupling interactions. FIG. 3D shows the coupling interactions for memory cell 301. In FIG. 3D, $\gamma_{fg\text{-}cg}$ is the coupling ratio between the floating gate and the control gate, $\gamma_{fg\text{-}wl}$ is the coupling ratio between the floating gate and the word gate, and $\gamma_{fg\text{-}diff}$ is the coupling ratio between the floating gate and the diffusion. V(FG) for 313=V(WL)×$\gamma_{fg\text{-}wl}$+V(CGI )×$\gamma_{fg\text{-}cg}$+V(B1)×$\gamma_{fg\text{-}diff}$. In this invention, control gate voltages are manipulated to isolate the behavior of an individual floating gate from a pair of floating gates.

There are three control gate voltage states: "over-ride", "express", and "suppress". A description of the control gate voltage states follows, in which the word line voltage is assumed to be 2.5V, the "bit"diffusion voltage is 0V, and the "source" diffusion voltage is assumed to be 1.2V. The coupling capacitances for this example are: 0.55, 0.3 and 0.15, for $\gamma_{fg\text{-}cg}$, $\gamma_{fg\text{-}wl}$, and $\gamma_{fg\text{-}diff}$, respectively. It should be understood that the voltages and coupling capacitances given are examples for only one of many possible applications, and not to be limiting in any way. In the over-ride state, the V(CG) is raised to a high voltage (~5V), which in turn couples to raise the floating gate to a voltage (~3.4V) higher than its highest possible Vt (2.0V), forcing the floating gate to conduct regardless of its threshold state. In the express state, the floating gate voltage is raised to about Vt-hi (2.0V), in order to allow the floating gate to express its programmed threshold state. In suppress-mode, the control gate is set to 0V, and the associated floating gate voltage (0.75V) is near Vt-lo (0.8V), to suppress conduction.

Table 1 gives the voltages during read of a selected floating gate, based on the coupling capacitance ratios: 0.55, 0.3 and 0.15, for $\gamma_{fg\text{-}cg}$, $\gamma_{fg\text{-}wl}$, and $\gamma_{fg\text{-}diff}$, respectively.

TABLE 1

Voltages for Read of Selected FG = 313
Assumptions: γfg-cg = 0.55, γfg-wl = 0.30, γfg-diff =0.15

| Vd0 | Vcg0 | Vfg | Vwl | Vfg | Vd1 | Vcg1 | Vfg | Vwl | Vfg | Vd2 | Vcg2 | Vfg | Vwl | Vfg | Vd3 | Vcg3 |
| 320 | 330 | 310 | 340 | 311 | 321 | 331 | 312 | 341 | 313 | 322 | 332 | 314 | 342 | 315 | 323 | 333 |
| --- | --- | --- | --- | --- | --- | --- | --- | --- | --- | --- | --- | --- | --- | --- | --- | --- |
| 0 | 0 | 0.75 | 2.5 | 3.68 | 1.2 | 5 | 3.68 | 2.5 | 2.1 | ~0 | 2.5 | 2.1 | 2.5 | 0.75 | 0 | 0 |

Figure 3C:
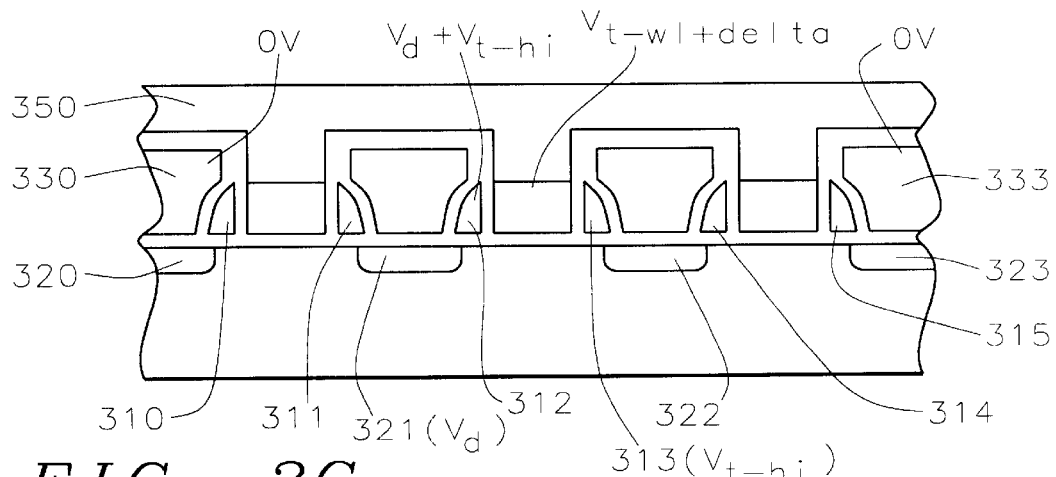
FIG. 3C gives the required voltage conditions for read of a double side wall dual-bit split gate cell with ultra short ballistic channel of the present invention.
Figure 3D:
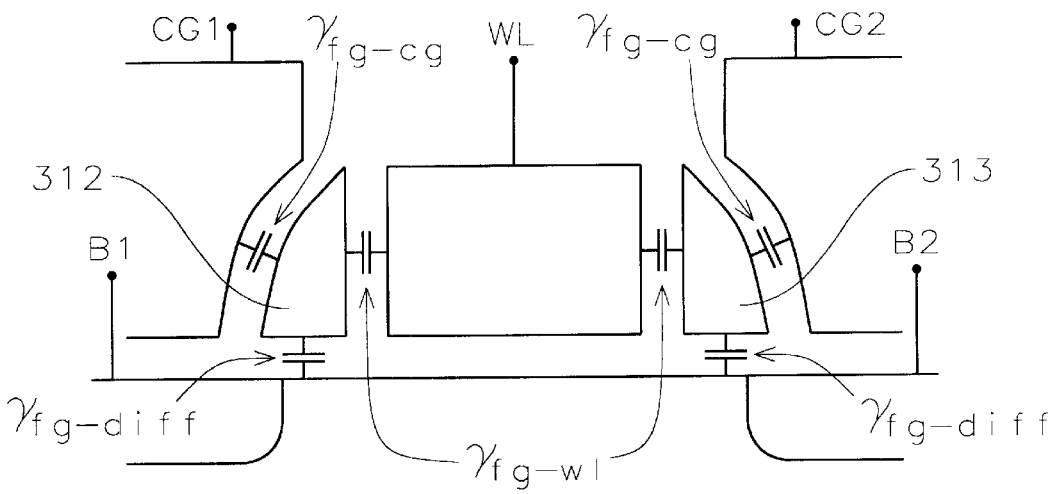
FIG. 3D gives the capacitive coupling interaction in memory cell 313.

During read operation of floating gate 313, shown in FIG. 3C, the source line 321 can be set to some intermediate voltage (~1.2V), and the bit line 322 may be precharged to 0V. In addition, the following conditions must be met in order to read a selected FG: 1) The word select gate voltage must be raised from 0V to a voltage (2.5V) which is some delta greater than the sum of the threshold voltage of the word select gate (Vt-wl=0.5V) and the source voltage (1.2V), and 2) The voltage of the control gate associated with the selected floating gate must be such that after capacitive coupling, the selected floating gate voltage is near Vt-hi ("express").

The voltage of the control gate associated with the unselected floating gate must be such that after capacitive coupling, the unselected floating gate voltage is greater than the source voltage plus Vt-hi ("over-ride"). The control gates associated with the far unselected adjacent floating gates must be zero ("suppress"), in order to prevent sensing interference from the adjacent cells. The voltage of the bit diffusion 322 can be monitored by a sense amplifier and compared to a switch-able reference voltage, or several sense amplifiers each with a different reference voltage, to determine the binary value that corresponds to floating gate 313's threshold voltage, in a serial or parallel manner, respectively. Thus, by over-riding the unselected floating gate within the selected memory cell, and suppressing the adjacent cell unselected floating gates, the threshold state of an individual selected floating gate can be determined.

For ballistic channel hot electron injection, electrons are energized by a high source-drain potential, to inject through the oxide and into the floating gate. The magnitude of the programmed threshold voltage can be controlled by the source-drain potential and program duration. Table 2 describes the voltages to program multiple threshold voltages to a selected floating gate 313. These voltages are for example only, to facilitate description of the program method, and are not limiting in any way. In table 2A, the control gates associated with the selected memory cell 301 are raised to a high voltage (5V) to override the floating gates 312 and 313.

TABLE 2a

Voltages for Program of Selected FG = 313
Assumptions: γfg-cg = 0.55, γfg-wl = 0.30, γfg-diff =0.15

| Vt Data | Vd0 320 | Vcg0 330 | Vfg 310 | Vwl 340 | Vfg 311 | Vd1 321 | Vcg1 331 | Vfg 312 | Vwl 341 | Vfg 313 | Vd2 322 | Vcg2 332 | Vfg 314 | Vwl 342 | Vfg 315 | Vd3 323 | Vcg3 333 |
| --- | --- | --- | --- | --- | --- | --- | --- | --- | --- | --- | --- | --- | --- | --- | --- | --- | --- |
| 00 | 0 | 0 | 0.75 | 2.5 | 3.5 | ~0 | 5 | 3.5 | 2.5 | 4.25 | 5 | 5 | 4.25 | 2.5 | 0.75 | 0 | 0 |
| 01 | 0 | 0 | 0.75 | 2.5 | 3.5 | ~0 | 5 | 3.5 | 2.5 | 4.18 | 4.5 | 5 | 4.18 | 2.5 | 0.75 | 0 | 0 |
| 10 | 0 | 0 | 0.75 | 2.5 | 3.5 | ~0 | 5 | 3.5 | 2.5 | 4.1 | 4.0 | 5 | 4.1 | 2.5 | 0.75 | 0 | 0 |

Program of the desired threshold level is determined by the bit diffusion 322: the bit diffusion 322 is fixed to 5V, 4.5V, or 4.0V in order to program threshold voltages of 2.0V, 1.6, and 1.2V respectively. When the word line 350 is raised above the word gate's 341 threshold, high energy electrons will be released into the channel, and injection begins. To inhibit program in the adjacent memory cells, the control gates associated with the far adjacent FG's are set to 0V, reducing the voltage of the far adjacent FG's to be near the Vt-low threshold, so there will be no electrons in the channels of the adjacent memory cells. Thus, multi-level threshold program can be achieved by bit diffusion voltage control. It is also possible to program multiple threshold voltages by varying the word line voltage; for example, 4.5V, 5V, and 5.5V to program 1.2V, 1.6V, and 2.0V, respectively.

An additional variation to the voltage conditions described above for multi-level program is given in Table 2B, in which the selected control gate voltage matches the bit voltage for Vd=5V, 4.5V, and 4.0V, and Vcg=5V, 4.5V and 4.0V respectively.

TABLE 2b

| Vt Data | Vd0 320 | Vcg0 330 | Vfg 310 | Vwl 340 | Vfg 311 | Vd1 321 | Vcg1 331 | Vfg 312 | Vwl 341 | Vfg 313 | Vd2 322 | Vcg2 332 | Vfg 314 | Vwl 342 | Vfg 315 | Vd3 323 | Vcg3 333 |
| --- | --- | --- | --- | --- | --- | --- | --- | --- | --- | --- | --- | --- | --- | --- | --- | --- | --- |
| 00 | 0 | 0 | 0.75 | 2.5 | 3.5 | 0 | 5 | 3.5 | 2.5 | 4.25 | 5 | 5 | 4.25 | 2.5 | 0.75 | 0 | 0 |
| 01 | 0 | 0 | 0.75 | 2.5 | 3.5 | ~0 | 4.5 | 3.2 | 2.5 | 3.9 | 4.5 | 4.5 | 3.9 | 2.5 | 0.75 | 0 | 0 |
| 10 | 0 | 0 | 0.75 | 2.5 | 3.5 | ~0 | 4.0 | 3.0 | 2.5 | 3.55 | 4.0 | 4.0 | 3.55 | 2.5 | 0.75 | 0 | 0 |

Another possible variation to the program conditions described above for multi-level program addresses the issue of program disturb. In the memory cells adjacent to 301, despite suppression by control gate voltages of 0V, the voltages of the far floating gates 310 and 315 are ~0.75V. Because the ballistic short-channel transistor has high program injection efficiency, it is possible that even small leakage currents will result in injection to floating gates 314. To prevent this program disturb, it is possible to raise the voltage of Vd3 to a low level of about 0.5~1.0V, thus reducing leakage current in the adjacent memory cell.

With this array and by the programming schemes described above, it is possible to program several cells on the same word line in a parallel operation. However, it should be noted that selected memory cells can have no fewer than two memory cells between each other, in order to obtain properly isolated behavior.

Tight Vt control for multi-level program can be obtained in two ways: by conventional program pulses, or by auto-program. In the conventional program pulse method, a program sequence is comprised of a program pulse followed by a program verify operation. If during program verify it is determined that the selected floating gate has reached the correct Vt, then program is inhibited for the selected cell during subsequent program pulses. Program operation is completed when all selected floating gates have reached their desired threshold targets. Short program pulses and frequent program verify operations will result in tight Vt distributions; however the overall program time is long because time is wasted during verify and switching between the program and verify modes. A more efficient method to obtain tight Vt distribution is by autoprogram, a programming scheme for ballistic step and/or planar side wall split gate transistors which has been proposed in co-pending U.S. patent application Ser. No. 09/120,361, filed Jul. 22, 1998, herein incorporated by reference. In autoprogram, the floating gate threshold is sensed during the actual program pulse, and program of the selected cell can be dynamically inhibited; program verify becomes an unnecessary step. Also with autoprogram, it is possible that when several cells are selected on the same word line 350, multiple thresholds can be programmed within the same cycle using a single word line voltage. The source diffusion of each selected cell will be connected to the drain of a load device. This source diffusion will be sensed by a feedback amplifier, which will dynamically determine operation of the load device.

Vt control for multi-level autoprogram may be obtained in several ways. The bit diffusion voltage may be varied and the reference to the feedback amplifier can be set. Or, the bit diffusion voltage may be set and the reference to the feedback amplifier could vary for the range of threshold targets. Furthermore, the control gate voltage is an additional parameter which can be varied with or without bit diffusion variation and/or reference voltage variation.

Removal of electrons from the floating gate during erase is done by F-N tunneling between the floating gate and diffusion. A negative voltage is applied to the control gate, and a positive voltage is applied to the diffusion for a floating gate. Byte erase is possible in that as few as two floating gates which share a control line and diffusion line can be selectively erased. Bit erase is also possible. Because the coupling is divided more equally between the control gate and the word gate, it is possible to put a negative voltage on a single word gate and erase a single bit.

PREFERRED EMBODIMENT FOR READ

Figure 7A:
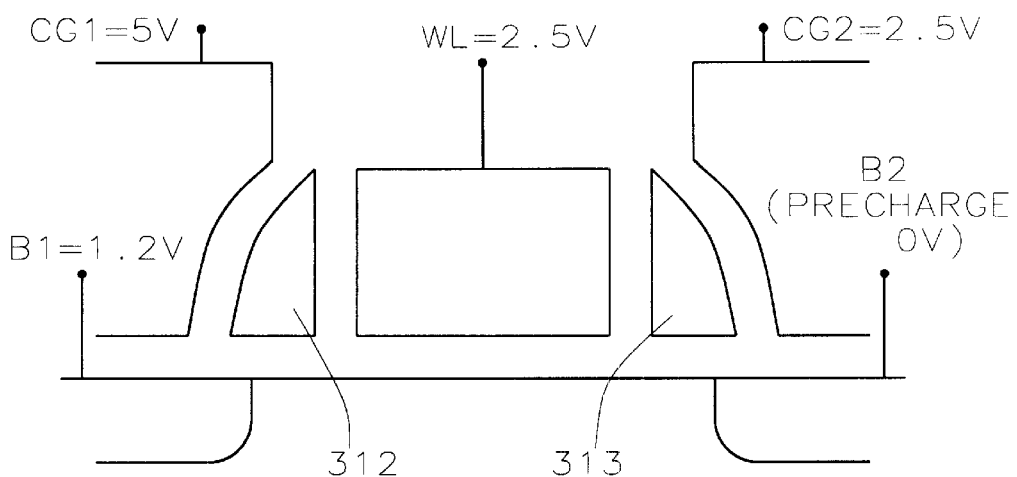
FIGS. 7a, 7b, and 7c are graphical representations of voltage sensing curves for the present invention during read.
Figure 7B:
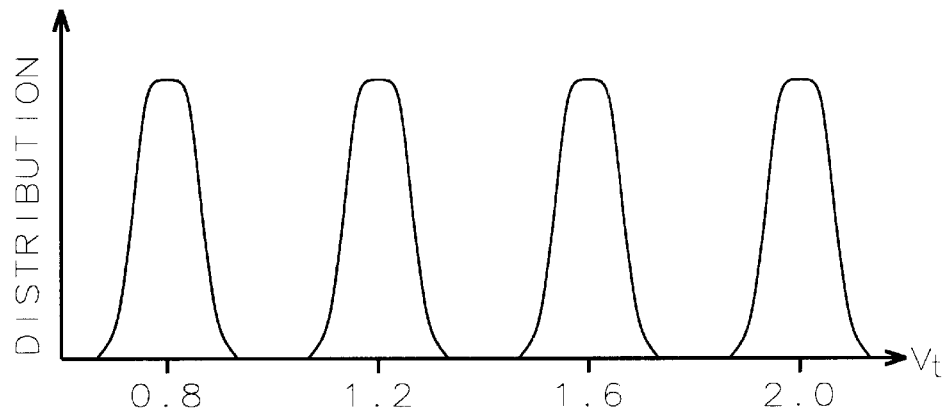

Read operation for a two bit multi-level storage in each of the floating gates will be described, based on simulations for a 0.25μ process. FIG. 7A illustrates the memory cell and voltage conditions for a read of floating gate 313. The threshold voltages for the four levels of storage are 0.8V, 1.2V, 1.6V, and 2.0V for the "11", "10", "01", and "00" states, respectively. This is shown in FIG. 7B. The threshold voltage for the word select gate is 0.5V. The capacitance coupling ratios between the control gate to floating gate, word gate to floating gate, and drain to floating gate are 0.55, 0.30 and 0.15, respectively. During read, the source voltage is fixed to 1.2V. The control gate associated with the unselected floating gate is set to 5V, and the control gate associated with the selected floating gate is set to 2.5V. All other control gates are set to zero, and the bit junction is precharged to zero.

When the word line is raised from 0V to 2.5V, based on the capacitance coupling ratios, the unselected floating gate will see a voltage of 3.68V, which is greater than the requirement of the sum of the source voltage and the highest threshold voltage (1.2+2.0=3.2). By raising the unselected floating gate voltage to 3.68, all effects from the various possible threshold states of the unselected floating gate will be over-ridden. On the other side of the word gate, if the associated control gate is 2.5V, the selected floating gate will see a voltage of 2.1V, which is close to the highest floating gate threshold voltage of 2.0V. In order to prevent interference from adjacent memory cells, the control gates associated with the far floating gates are set to zero.

Figure 7C:
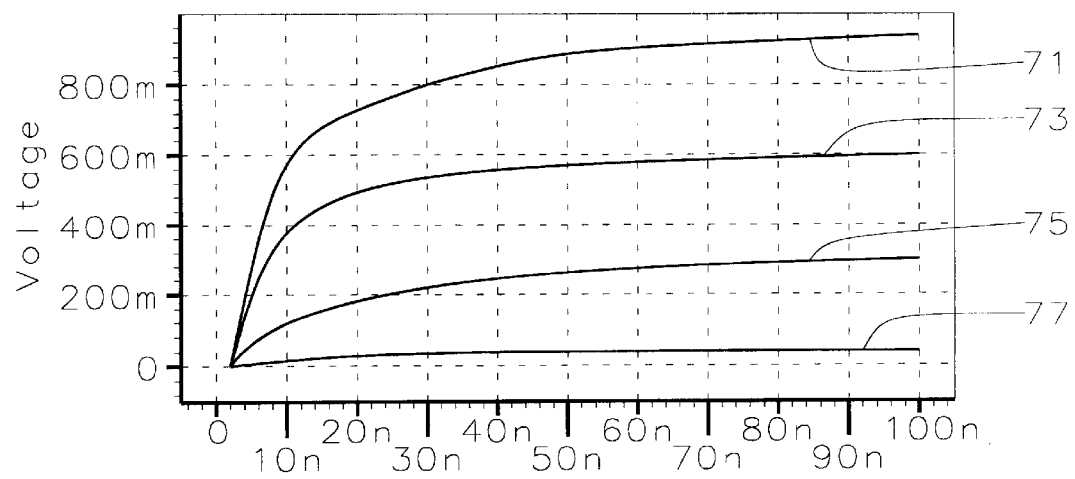

Sensing of the bit junction yields the curves shown in FIG. 7C. Bitline voltage sensing curves 71, 73, 75, and 77 during read of floating gate 313 are shown for different floating gate thresholds 0.8V, 1.2V, 1.6V, and 2.0V, respectively. It can be seen from the voltage curves, that the voltage difference between each of the states is approximately 300mV which is well within sensing margins. Simulation has also confirmed that the state of the unselected cell has very little impact on the bit junction voltage curve in FIG. 7C.

The present invention provides a method for forming a double sidewall floating gate sharing a word gate which provides an ultra short channel. The enhancement mode channel is around 35 nm and is defined by the sidewall spacer.

The isolation between the word gates is formed by a self-aligned SiO$_2$ filling technique. The polysilicon control gate is formed by a self-aligned technique using chemical mechanical polishing. The process of the invention includes two embodiments: a planar short channel structure with ballistic injection and a step split short channel structure with ballistic injection. A third embodiment provides isolation of adjacent word gates after floating gate and control gate definition.

While the invention has been particularly shown and described with reference to the preferred embodiments thereof, it will be understood by those skilled in the art that various changes in form and details may be made without departing from the spirit and scope of the invention.

What is claimed is:

1. A flash memory cell comprising:
    a word gate on the surface of a semiconductor substrate;
    floating gates on sidewalls of said word gate separated from said word gate by an insulating layer;
    a control gate on the surface of said semiconductor substrate adjacent to each of said floating gates and separated from each said floating gates by an insulating layer; and
    bit line diffusions within said semiconductor substrate and directly under each of said control gates.

2. The flash memory cell of claim 1, wherein one of said floating gates is a selected floating gate, and the other of said floating gates is an unselected floating gate, and wherein said bit line diffusion near said selected floating gate is a bit diffusion, and said bit line diffusion near said unselected floating gate is a source diffusion, wherein a read operation of said cell is performed by:

over-riding said unselected floating gate;

providing a voltage on said word gate having a sum of the word gate threshold voltage, an overdrive voltage, and a voltage on said source diffusion;

providing a voltage on said control gate adjacent to said selected floating gate sufficient to allow for reading of the selected floating gate; and reading said cell by measuring a voltage level on said bit diffusion.

3. The flash memory cell of claim 2 wherein said memory cell is one of many cells in a flash memory array, and further comprising applying a control gate voltage of 0 volts to all cells beside the cell desired to be read.

4. The flash memory cell of claim 2 wherein the voltage level on said bit diffusion may represent one of multiple levels of said cell.

5. The flash memory cell of claim 1, wherein one of said floating gates is a selected floating gate, and the other of said floating gates is an unselected floating gate, and wherein said bit line diffusion near said selected floating gate is a bit diffusion, and said bit line diffusion near said unselected floating gate is a source diffusion, wherein a program operation of said cell is performed by:

providing a voltage on said word gate which is greater than a sum of the word gate threshold voltage and an overdrive voltage;

providing a voltage on said floating gates which is greater than a sum of the highest floating gate threshold voltage and an override delta voltage; and varying a voltage on said bit diffusion, or varying said voltage on said word gate, or varying voltages on said control gates and said bit diffusion.

6. The flash memory cell of claim 5 wherein said providing a voltage on said floating gates which is greater than a sum of the highest floating gate threshold voltage and an override delta voltage is accomplished by raising a voltage on said control gates to a high level.

7. The flash memory cell of claim 5 wherein said memory cell is one of many cells in a flash memory array, and further comprising disabling floating gates in adjacent cells sharing a word line by applying a control gate voltage of 0 volts to said adjacent cells.

8. The flash memory cell of claim 5 wherein said memory cell is one of many cells in a flash memory array that share a word line, and further comprising simultaneously programming several of said cells, wherein said cells to be programmed are separated by two or more unprogrammed cells.

9. The flash memory cell of claim 1, wherein an erase operation of one of said floating gates is performed by:

providing a negative voltage to one of said control gates; and providing a positive voltage to said bit line diffusion under said one of said control gates.

10. The flash memory cell of claim 9 wherein said erase operation is a byte erase, wherein said memory cell is one of many cells in a flash memory array, and wherein as few as two floating gates which share a control line and a diffusion line are erased simultaneously.

11. The flash memory cell of claim 9 wherein said erase operation is a bit erase, wherein said memory cell is one of many cells in a flash memory array, further comprising placing a negative voltage on said word gate in order to erase only said memory cell.

12. A flash memory device comprising:

word gates on the surface of a semiconductor substrate;

floating gates on the sidewalls of said word gates separated from said word gates by an insulating layer;

bit line diffusions within said semiconductor substrate between two of said floating gates; and control gates between said floating gates on top of and in the direction of said bit line diffusions and perpendicular to said word gates.

13. The device according to claim 12 further comprising:

an insulating layer overlying said control gates; and a word line overlying said control gates and connecting said word gates.

14. A planar channel flash memory device comprising:

word gates on the surface of a semiconductor substrate;

floating gates on the sidewalls of said word gates separated from said word gates by an insulating layer;

bit line diffusions within said semiconductor substrate between two of said floating gates wherein said bit line diffusions form said planar channel; and control gates between said floating gates on top of and in the direction of said bit line diffusions and perpendicular to said word gates.

15. A step channel flash memory device comprising:

word gates on the surface of a semiconductor substrate;

floating gates on the sidewalls of said word gates separated from said word gates by an insulating layer;

bit line diffusions within said semiconductor substrate between two of said floating gates wherein said semiconductor substrate between said tow of said floating gates is recessed to form said step channel; and control gates between said floating gates on top of and in the direction of said bit line diffusions and perpendicular to said word gates.

16. The flash memory device of claim 12, wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a read operation of said memory cell is performed by:

over-riding said unselected floating gate;

providing a voltage on said word gate having a sum of the word gate threshold voltage, an overdrive voltage, and a voltage on said source diffusion;

providing a voltage on said control gate adjacent to said selected floating gate sufficient to allow for reading of the selected floating gate; and reading said cell by measuring a voltage level on said bit diffusion.

17. The flash memory device of claim 16 further comprising applying a control gate voltage of 0 volts to all cells beside the cell desired to be read.

18. The flash memory cell of claim 16 wherein the voltage level on said bit diffusion may represent one of multiple levels of said cell.

19. The flash memory cell of claim 12 wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a program operation of said cell is performed by:

providing a voltage on said word gate which is greater than a sum of the word gate threshold voltage and an overdrive voltage;

providing a voltage on said floating gates which is greater than a sum of the highest floating gate threshold voltage and an override delta voltage; and varying a voltage on said bit diffusion, or varying said voltage on said word gate, or varying voltages on said control gates and said bit diffusion.

20. The flash memory cell of claim 19 wherein said providing a voltage on said floating gates which is greater than a sum of the highest floating gate threshold voltage and an override delta voltage is accomplished by raising a voltage on said control gates to a high level.

21. The flash memory cell of claim 19 further comprising disabling floating gates in adjacent cells sharing a word line by applying a control gate voltage of 0 volts to said adjacent cells.

22. The flash memory cell of claim 19 wherein said memory cell is one of many cells in said flash memory device that share a word line, and further comprising simultaneously programming several of said cells, wherein said cells to be programmed are separated by two or more unprogrammed cells.

23. The flash memory device of claim 12, wherein an erase operation of one of said floating gates is performed by:

providing a negative voltage to one of said control gates; and providing a positive voltage to said bit line diffusion under said one of said control gates.

24. The flash memory device of claim 23 wherein said erase operation is a byte erase and wherein as few as two floating gates which share a control line and a diffusion line are erased simultaneously.

25. The flash memory device of claim 23 wherein said erase operation is a bit erase further comprising placing a negative voltage on said word gate in order to erase only one of said floating gates.

26. The planar channel flash memory device of claim 14, wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a read operation of said memory cell is performed by:

over-riding said unselected floating gate; providing a voltage on said word gate having a sum of the word gate threshold voltage, an overdrive voltage, and a voltage on said source diffusion;

providing a voltage on said control gate adjacent to said selected floating gate sufficient to allow for reading of the selected floating gate; and reading said cell by measuring a voltage level on said bit diffusion.

27. The planar channel flash memory device of claim 26 further comprising applying a control gate voltage of 0 volts to all cells beside the cell desired to be read.

28. The planar channel flash memory cell of claim 26 wherein the voltage level on said bit diffusion may represent one of multiple levels of said cell.

29. The planar channel flash memory cell of claim 14 wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a program operation of said cell is performed by:

providing a voltage on said word gate which is greater than a sum of the word gate threshold voltage and an overdrive voltage;

providing a voltage on said floating gates which is greater than a sum of the highest floating gate threshold voltage and an override delta voltage; and varying a voltage on said bit diffusion, or varying said voltage on said word gate, or varying voltages on said control gates and said bit diffusion.

30. The planar channel flash memory cell of claim 29 wherein said providing a voltage on said floating gates which is greater than a sum of the highest floating gate threshold voltage and an override delta voltage is accomplished by raising a voltage on said control gates to a high level.

31. The planar channel flash memory cell of claim 29 further comprising disabling floating gates in adjacent cells sharing a word line by applying a control gate voltage of 0 volts to said adjacent cells.

32. The planar channel flash memory cell of claim 29 wherein said memory cell is one of many cells in said flash memory device that share a word line, and further comprising simultaneously programming several of said cells, wherein said cells to be programmed are separated by two or more unprogrammed cells.

33. The planar channel flash memory device of claim 14, wherein an erase operation of one of said floating gates is performed by:

providing a negative voltage to one of said control gates; and providing a positive voltage to said bit line diffusion under said one of said control gates.

34. The planar channel flash memory device of claim 33 wherein said erase operation is a byte erase and wherein as few as two floating gates which share a control line and a diffusion line are erased simultaneously.

35. The planar channel flash memory device of claim 33 wherein said erase operation is a bit erase further comprising placing a negative voltage on said word gate in order to erase only one of said floating gates.

36. The step channel flash memory device of claim 15, wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a read operation of said memory cell is performed by:

over-riding said unselected floating gate; providing a voltage on said word gate having a sum of the word gate threshold voltage, an overdrive voltage, and the voltage on said source diffusion;

providing a voltage on said control gate adjacent to said selected floating gate sufficient to allow for reading of the selected floating gate; and reading said cell by measuring the voltage level on said bit diffusion.

37. The step channel flash memory device of claim 36 further comprising applying a control gate voltage of 0 volts to all cells beside the cell desired to be read.

38. The step channel flash memory cell of claim 36 wherein the voltage level on said bit diffusion may represent one of multiple levels of said cell.

39. The step channel flash memory cell of claim 15 wherein a memory cell comprises one of said word gates and associated said floating gates, said control gate, and said bit line diffusions, wherein one of said floating gates in said memory cell is a selected floating gate, and the other of said floating gates is an unselected floating gate, and wherein said bit line diffusion near said selected floating gate is a bit diffusion, and said bit line diffusion near said unselected floating gate is a source diffusion, wherein a program operation of said cell is performed by:

providing a voltage on said word gate which is greater than a sum of the word gate threshold voltage and an overdrive voltage;

providing a voltage on said floating gates which is greater than a sum of the highest floating gate threshold voltage and an override delta voltage; and varying a voltage on said bit diffusion, or varying said voltage on said word gate, or varying voltages on said control gates and said bit diffusion.

40. The step channel flash memory cell of claim 39 wherein said providing a voltage on said floating gates which is greater than a sum of the highest floating gate threshold voltage and an override delta voltage is accomplished by raising a voltage on said control gates to a high level.

41. The step channel flash memory cell of claim 39 further comprising disabling floating gates in adjacent cells sharing a word line by applying a control gate voltage of 0 volts to said adjacent cells.

42. The step channel flash memory cell of claim 39 wherein said memory cell is one of many cells in said flash memory device that share a word line, and further comprising simultaneously programming several of said cells, wherein said cells to be programmed are separated by two or more unprogrammed cells.

43. The step channel flash memory device of claim 15, wherein an erase operation of one of said floating gates is performed by:

providing a negative voltage to one of said control gates; and providing a positive voltage to said bit line diffusion under said one of said control gates.

44. The step channel flash memory device of claim 43 wherein said erase operation is a byte erase and wherein as few as two floating gates which share a control line and a diffusion line are erased simultaneously.

45. The step channel flash memory device of claim 43 wherein said erase operation is a bit erase further comprising placing a negative voltage on said word gate in order to erase only one of said floating gates.

* * * * *